United States Patent [19]

Nakagawa et al.

[11] Patent Number: 4,547,669
[45] Date of Patent: Oct. 15, 1985

[54] ELECTRON BEAM SCANNING DEVICE

[75] Inventors: Seiichi Nakagawa; Setsuo Norioka, both of Tokyo, Japan

[73] Assignee: Jeol Ltd., Tokyo, Japan

[21] Appl. No.: 534,833

[22] Filed: Sep. 22, 1983

[30] Foreign Application Priority Data

Sep. 27, 1982 [JP] Japan .................. 57-168178

[51] Int. Cl.⁴ ........................... G01N 23/00
[52] U.S. Cl. .................... 250/310; 250/397
[58] Field of Search ............ 250/310, 311, 396 R, 250/397, 505.1; 219/121 EP, 121 ER

[56] References Cited

U.S. PATENT DOCUMENTS

| 3,560,781 | 2/1971 | Riecke ................... 250/396 |
| 4,210,806 | 7/1980 | Broers ................... 250/311 |
| 4,321,510 | 3/1982 | Takigawa ............... 250/397 |
| 4,424,448 | 1/1984 | Takigawa et al. ....... 250/397 |

FOREIGN PATENT DOCUMENTS 114173 9/1979 Japan ..................... 250/397

Primary Examiner—Bruce C. Anderson
Attorney, Agent, or Firm—Webb, Burden, Robinson & Webb

[57] ABSTRACT

A converging lens system of the electron beam scanning device incorporates a condenser lens (or lenses), an objective lens and an aperture means being capable of changing the aperture diameter so as to produce an electron beam spot on a specimen and vary the electron beam current on the specimen. The optimum aperture diameter is determined based on the designated electron beam current and the accelerating voltage of the electron beam by means of a data processor, so that the minimum diameter of the electron beam is formed on the specimen.

7 Claims, 5 Drawing Figures

ELECTRON BEAM SCANNING DEVICE

BACKGROUND OF THE INVENTION

This invention relates to an electron beam scanning device including an electron probe microanalyzer, a scanning electron microscope and an electron beam exposure system where the device is capable of producing the electron beam spot on a specimen or target and also adjusting the electron beam current on the specimen or target by means of a converging lens system.

In electron probe microanalyzers and scanning electron microscopes, it is necessary to vary the electron beam accelerating voltage and the current value of the electron beam irradiating a specimen, within very wide ranges, namely 100 V~several tens KV and $10^{-12}$ A~$10^{-6}$ A, respectively. Further, it is also necessary to vary the working distance, namely the distance between the specimen surface and the lower pole piece of the objective lens (i.e. final stage condenser lens) within the wide range, and to stepwise change the aperture diameter of the aperture means for controlling the angle of the cone of electron beams in the converged spot on the specimen surface.

An operator usually controls the above accelerating voltage (Ve), electron beam current (Ie), working distance (Wd) and aperture diameter (Da) manually according to the specimen kind, whether it is an organism, metal, semiconductor, ceramic or some other specimen, and the surface condition of the specimen so that a high signal-to-noise ratio in the video signal and a high resolution scanning electron image are obtained. The accelerating voltage (Ve) and working distance (Wd) among the above four controllable factors are determined readily by comparison based only on the specimen kind and the surface condition of the specimen. However, it is difficult to optimally select the aperture diameter (Da) for producing the minimum diameter of the electron beam spot on the specimen surface under the condition of the desired beam current (Ie) and the selected values of the other two factors. Usually, this selection is based upon the operator's prior trial and error experience. This selection is a troublesome and time consuming operation.

SUMMARY OF THE INVENTION

It is an object of this invention to facilitate the operation for selecting the optimum aperture diameter (Da) according to the given values of the factors accelerating voltage (Ve), beam current (Ie) and working distance (Wd).

Another object of this invention is to provide a device for automatically controlling the converging lens system in order to obtain the desired beam current (Ie) with the minimum diameter of the electron beam spot on the specimen surface.

These and other objects are achieved by providing a data processor for determining the optimum diameter of the aperture, which determines the angle of the cone of electron beams in the converged spot on the specimen, based on the accelerating voltage of the electron beam and the electron beam current on the specimen.

DETAILED DESCRIPTION OF THE PREFERRED EMBODIMENTS

Figure 1:
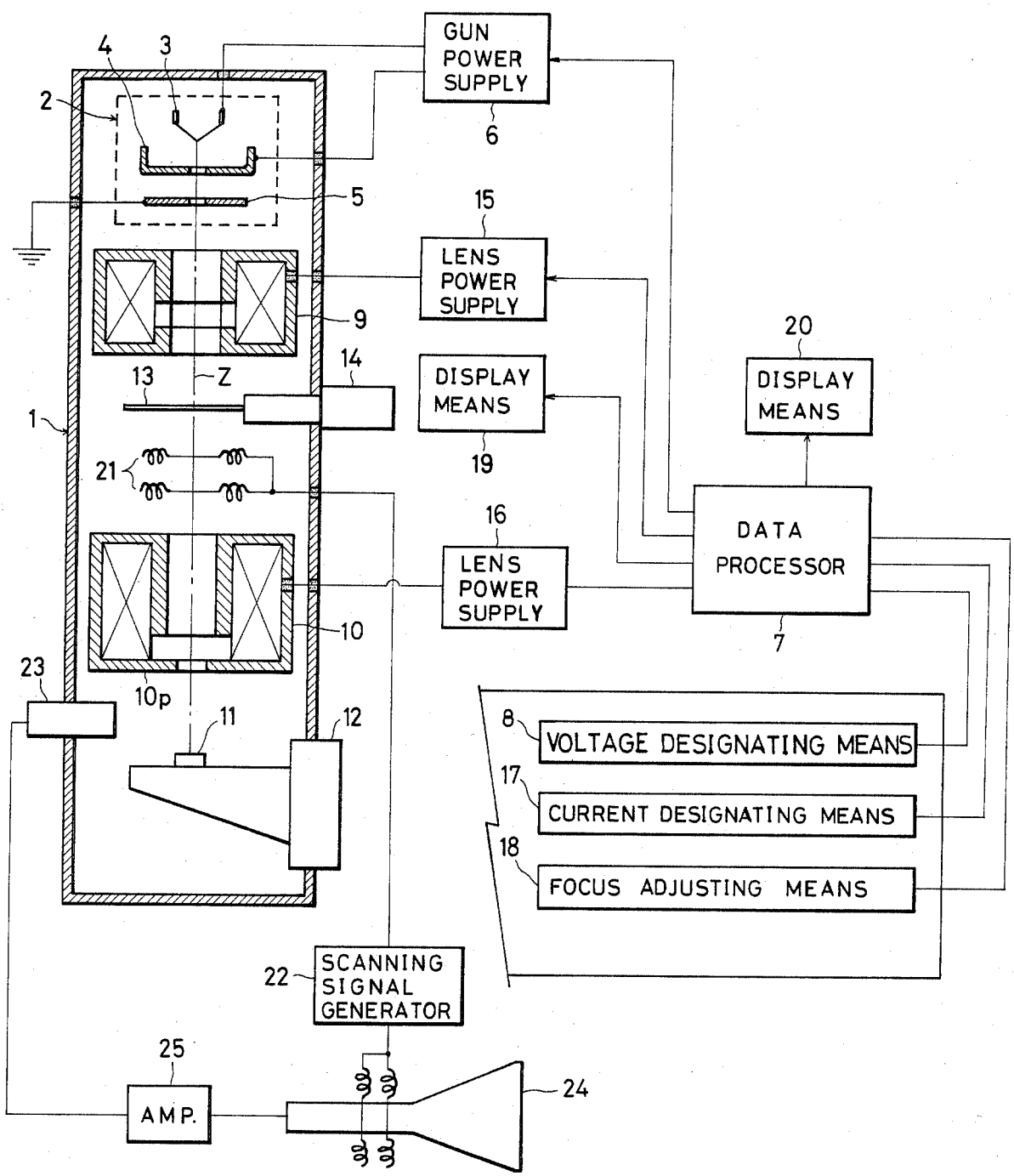
FIG. 1 is a schematic drawing showing one embodiment according to this invention.

The electron beam scanning device of the preferred embodiment of the invention is shown in FIG. 1. In FIG. 1, a column 1 is vacuum tight to permit an electron gun 2 and electron beam to operate in a vacuum. The electron gun 2 is composed of a cathode 3, a control electrode 4 and an anode 5. An electron gun power supply 6 supplies negative high accelerating voltage (Ve) between the cathode 3 and the anode 5 maintained at ground potential for accelerating the electron beam emitted from the cathode 3 along the optical axis Z of the device, and supplies control voltage between the cathode 3 and the control electrode 4 for controlling the total beam current and for maintaining the brightness of the electron beam source at optimum (most high) values corresponding to the accelerating voltage (Ve). The outputs of the power supply 6 are controlled by the data processor 7, to which the designating signal from the voltage designating means 8 arranged in the operational panel of the device is supplied.

The electron beam emitted from the electron gun 2 is converged by a condenser lens 9 and an objective lens 10 in that order, so that the reduced image of the assumed electron beam source of the electron gun 2 is formed on a specimen 11 placed on a specimen stage 12. The aperture 13 supported by its driving mechanism 14 is more important than the other apertures (not shown) which are located between the electron gun 2 and the specimen 11 for obstructing the excess electron beam or scattered electron beam, because the aperture diameter (Da) of the aperture 13 determines the angle of the cone of electron beams in the converged spot on the specimen. The aperture 13 comprises a thin foil in which many aperture holes having various diameters are made along the X axis crossing at right angles to the Z axis for locating the center of a certain aperture hole having the desired diameter at the Z axis by manual operation. The specimen stage 12 incorporates a mechanism for shifting the specimen 11 along the Z axis and changing the working distance (Wd) between the specimen surface and the lower pole piece 10p of the objective lens 10. The lenses 9 and 10 are excited by the lens power supplies 15 and 16 respectively, and the outputs of the power supplies 15 and 16 are controlled by the data processor 7, to which the output signals of a current designating means 17 and a focus adjusting means 18 are supplied. The outputs of the data processor 7 are supplied to a display means 19 for displaying the optimum diameter (Da) of the aperture 13, and a display means 20 for displaying the beam current (Ie).

For displaying a scanning image, the electron beam is scanned over the specimen surface two-dimensionally by means of a deflection coil 21 energized by the scanning signal generator 22, and the secondary electrons emitted from the specimen 11 is detected by a detector 23 as a video signal and is fed to a cathode-ray tube (CRT) 24 as a brightness modulation signal via an amplifier 25. The output of the scanning signal generator 22 is also fed to the CRT 24, so that the scanning image is displayed on the screen of the CRT 24.

Figure 2:
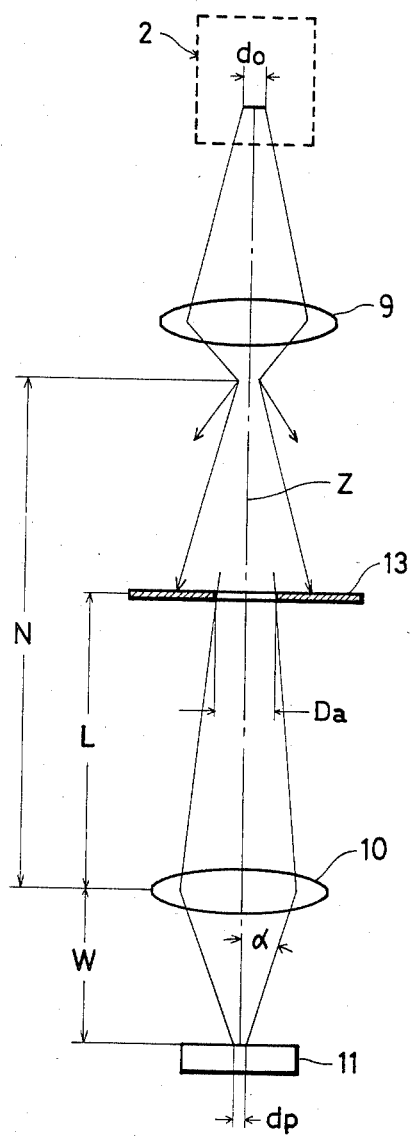
FIG. 2 is a schematic drawing showing the electron beam path in the embodiment shown in FIG. 1.

FIG. 2 illustrates a simplified ray trace of the electron beam path in the embodiment shown in FIG. 1. In FIG. 2, the electron beam emitted and diverged from the electron gun 2 is converged by the condenser lens 9 and the objective lens 10 in that order, and forms the very small round spot on the specimen surface. The distance W is indicated by the equation $W = Wd + Zp$, where $Zp$ is the distance between the lower surface of the lower pole piece 10p of the objective lens 10 and the principal plane of the objective lens 10. The diameter dp of the spot is indicated by the following approximate equation (1), where do is the diameter of the assumed electron beam source in the electron gun and ds is the smallest possible beam diameter allowing only spherical aberration of the converging lens system.

$$dp \simeq (d_o^2 + d_s^2)^{\frac{1}{2}} \tag{1}$$

The equation (1) is also indicated by the following equation (2), where Ve is the accelerating voltage (volts), Ie is the beam current on the specimen (amperes), $\beta$ is the brightness of the electron gun (amperes/(cm)$^2$·(sterad.)), Cs is the spherical aberration coefficient of the converging lens system (especially of the objective lens) arranged between the electron gun 2 and the specimen 11, and $\alpha$ is the half angle of the cone of the electron beam in the converged spot on the specimen surface and is determined by the diameter (Da) of the aperture 13 and the working distance (Wd).

$$dp = \left[ \left( \frac{4Ie}{\pi^2 \beta} + \frac{5.58 \times 10^{-8}}{V_e} \right) \frac{1}{\alpha^2} \left( \frac{1}{2} C_s \right)^2 \cdot \alpha^6 \right]^{\frac{1}{2}} \tag{2}$$

Figure 3:
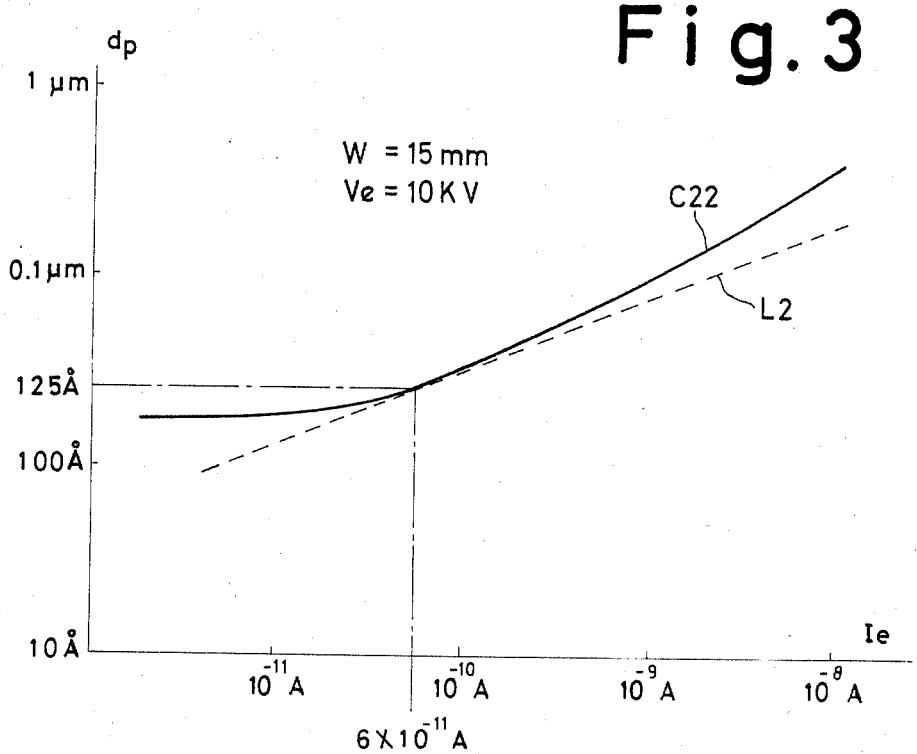
FIGS. 3 and 4 are the graphs showing the relation between the electron beam current on the specimen and the spot diameter of the electron beam converged on the specimen.

The curve C22 shown in FIG. 3 indicates the relation between the electron beam current (Ie) and the beam diameter (dp) under the condition of Da=110 μm, W=15 mm and Ve=10 KV. The curves (not shown) similar to curve C22 are obtained by varying the value of Da under the condition of W=15 mm and Ve=10 KV. The broken line L2 is the envelope line of these curves. The point of contact of the curve C22 and the line L2 means that the minimum beam diameter dm=125 Å under the condition of Ie=6×10$^{-11}$ A and Ve=10 KV is obtained by selecting the aperture diameter Da equal to 110 μm. Generally, the minimum beam diameter (dm) and the optimum half angle value ($\alpha$op) corresponding to the minimum beam diameter (dm) are shown as following equations (3) and (4).

$$dm = \left( \frac{Ie}{2.47\beta} + \frac{5.58 \times 10^{-5}}{V_e} \right)^{\frac{3}{8}} \cdot C_s^{\frac{1}{4}} \tag{3}$$

$$\alpha_{op} = \left( \frac{Ie}{2.47\beta} + \frac{5.58 \times 10^{-5}}{V_e} + \frac{5.38}{C_s^2} \right)^{\frac{1}{8}} \tag{4}$$

The coefficient of the spherical aberration (Cs) in equations (3) and (4) is maintained at constant value at each value of the working distance (Wd) in every scanning beam device. And the brightness ($\beta$) of the electron gun 2 in equations (3) and (4) is maintained at an almost constant value at each value of accelerating voltage (Ve).

In order to vary the beam current (Ie) in equations (3) and (4), the lens power supply 15 is varied. Namely, the large electron beam current (Ie) is obtained by decreasing the output of the lens power supply 15 so that the ratio of the electron beam that passed through the aperture 13 and the total electron beam emitted from the electron gun 2 is increased. Inversely, the small electron beam current (Ie) is obtained by increasing the output of the lens power supply 15 so that the ratio of the electron beam that passed through the aperture 13 and the total electron beam emitted from the electron gun 2 is decreased.

The focusing condition of the electron beam on the specimen surface is adjusted by controlling the output strength of the lens power supply 16 so that the scanning image displayed on the screen of the CRT 24 becomes distinct. By carrying out this focusing operation correctly, it is possible to know the distance (W). Namely, the focal length of the objective lens is calculated by considering the value of the adjusted output value of the lens power supply 16 and the accelerating voltage (Ve). And the distance (W) is known from the calculated focal length of the objective lens 10 and the geometrical relation shown in FIG. 2. Accordingly, it is possible to utilize the focus adjusting means 18 as a positioning signal generator for generating the positional signal corresponding to the distance (W).

The half angle ($\alpha$) in the equations (3) and (4) is varied by changing the diameter (Da) of the aperture 13 and/or the working distance (Wd).

Figure 4:
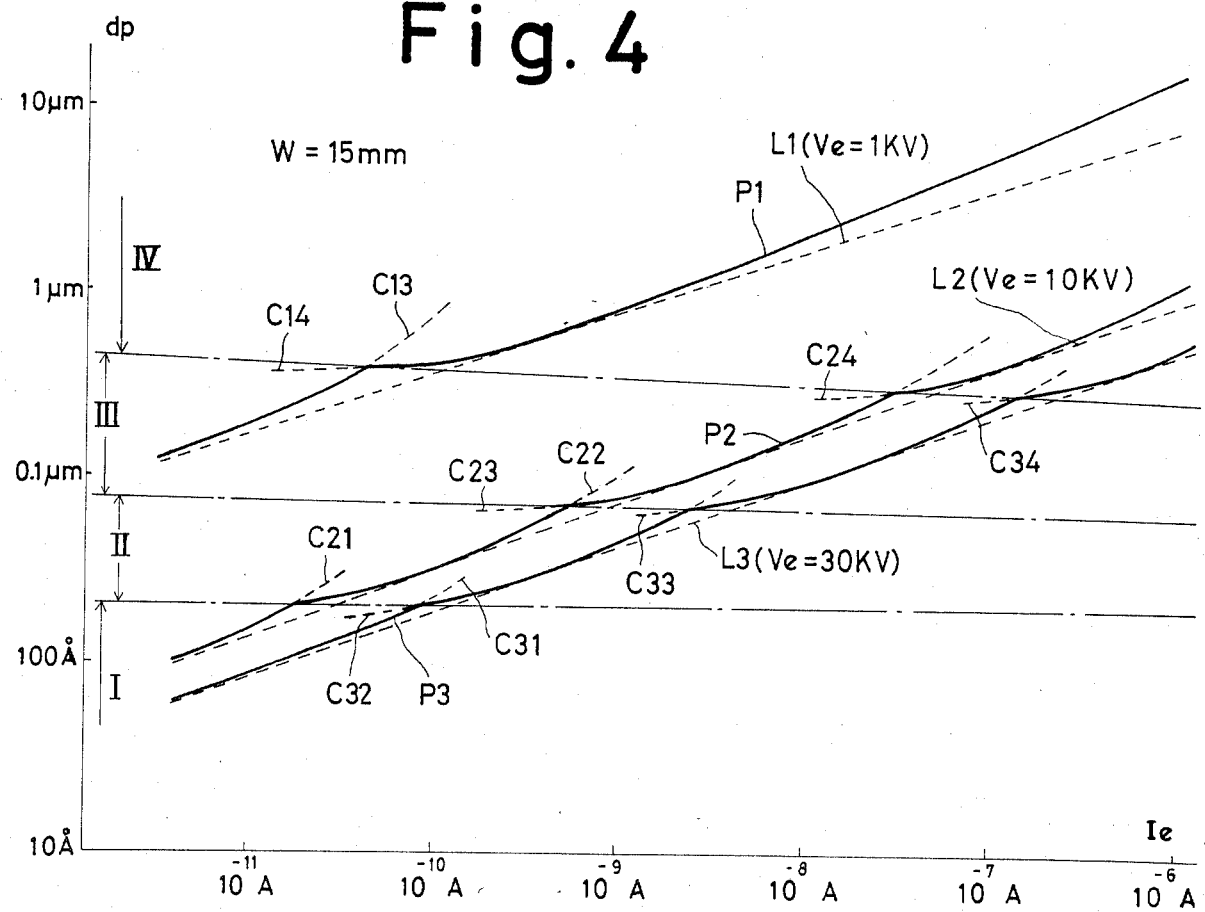

The three straight broken lines L1, L2 and L3 in FIG. 4 show the relation between the beam diameter (dp) and the beam current (Ie). These lines are obtained from equation (3) for the parameter Ve=1 KV, 10 KV and 30 KV and the constant W=15 mm respectively. In the special device in which the half angle ($\alpha$) or aperture diameter (Da) is varied continuously, it is possible to control the converging lens system which satisfies the relation shown by the above broken lines strictly. And in the conventional device in which the aperture diameter (Da) is varied stepwise, for example Da=50 μm, 70 μm, 110 μm or 170 μm, it is possible to control the converging lens system by satisfying the relation shown by the curve P1, P2 or P3 instead of the broken lines L1, L2 and L3. The curves P1, P2 or P3 are composed of the several curves C13 ... C14, C21 ... C24, and C31 ... C34 respectively, and are obtained by changing the aperture diameter (Da) according to the ranges I, II, III and IV shown in FIG. 4.

From the curves P1, P2 and P3 in FIG. 4, the data shown in TABLE is obtained in the condition of the constant W=15 mm. The curves P1, P2, P3 are of course shifted and/or varied slightly by changing the parameter Wd. Consequently, the other similar data corresponding to TABLE are obtained against each condition, for example, W=20 mm, 40 mm.

TABLE

| ACCELERATING VOLTAGE (Ve) | APERTURE DIAMETER (Da) | | | |
|---|---|---|---|---|
| | (A) 50 μm | (B) 70 μm | (C) 110 μm | (D) 170 μm |
| 1 KV | — | — | $\leq 6 \times 10^{-11}$ A | $\leq 1 \times 10^{-6}$ A |

TABLE-continued

| ACCELERATING VOLTAGE (Ve) | APERTURE DIAMETER (Da) | | | |
|---|---|---|---|---|
| | (A) 50 μm | (B) 70 μm | (C) 110 μm | (D) 170 μm |
| 10 KV | $\leq 2 \times 10^{-11}$ A | $\leq 6 \times 10^{-10}$ A | $\leq 4 \times 10^{-8}$ A | $\leq 1 \times 10^{-6}$ A |
| 30 KV | $\leq 1 \times 10^{-10}$ A | $\leq 3 \times 10^{-9}$ A | $\leq 1.5 \times 10^{-7}$ A | $\leq 1 \times 10^{-6}$ A |

In the ROM (read only memory) of the data processor 7 in FIG. 1, the data of the TABLE and other similar tables are previously memorized. And the data processor 7 determines the table, for example TABLE, according to W=15 mm signal from the focus adjusting means 18. Further, the line, for example line of 10 KV, in the TABLE is determined according to the accelerating voltage (Ve) signal from the voltage designating means 8, and the column, for example ($\leq 6 \times 10^{-10}$ A), in TABLE is determined according to the Ie=$2 \times 10^{-11}$ A signal from the current designating means 17, so that the aperture diameter 70 μm is determined. The data processor 7 supplies the display means 19 with the display signal so that the above determined aperture diameter or aperture name, for example B (or A, C or D), is displayed on the display means 19. Further, data processor 7 supplies the display means 20 with the signal read out from the ROM in which the data expressing the curves P1, P2 or P3 is memorized previously, so that the beam diameter (dp) is displayed on the display means 20. Accordingly, the optimum (and almost minimum) beam diameter is obtained when the operator operates the aperture driving mechanism 14 according to the display means 19.

Figure 5:
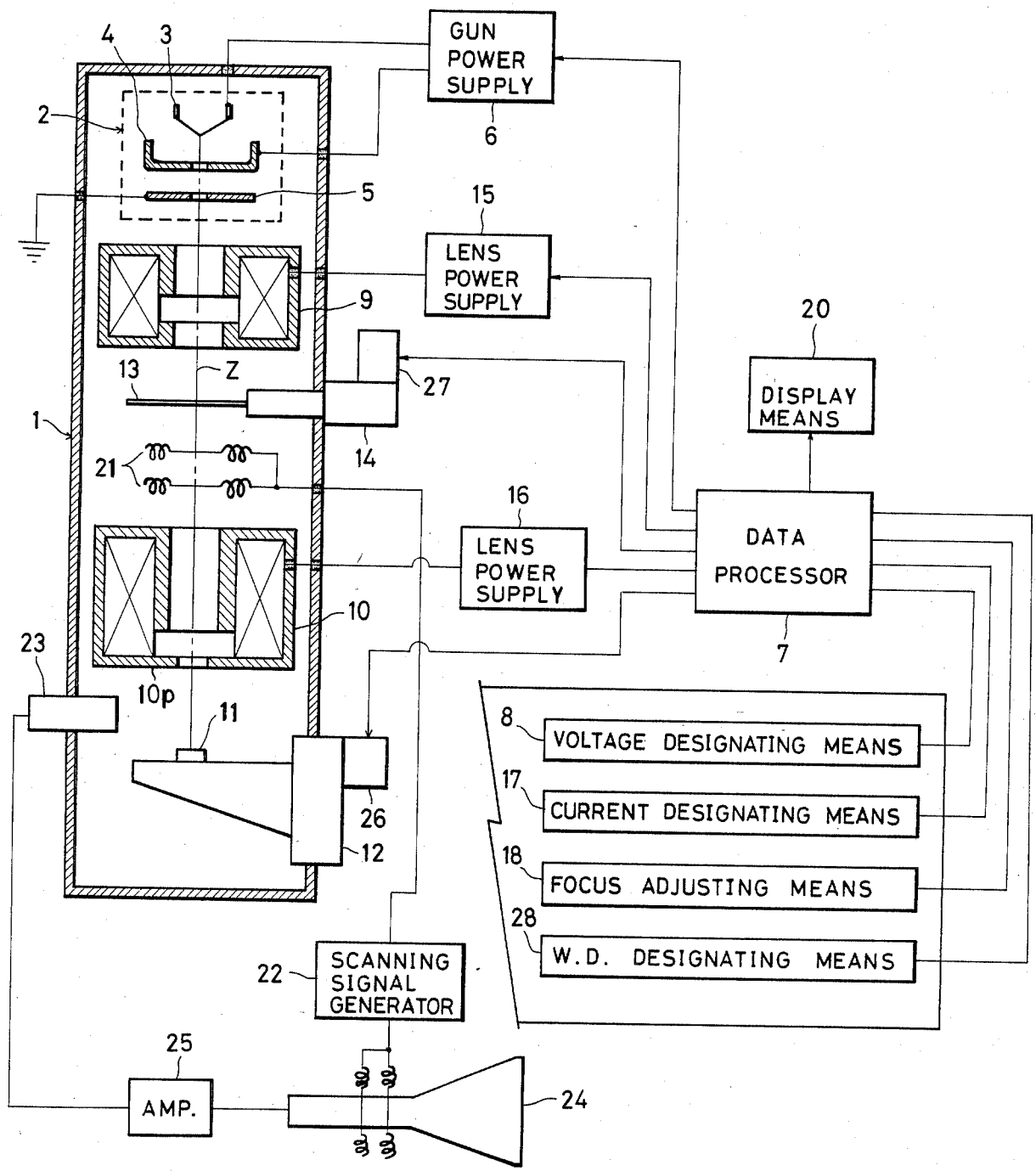
FIG. 5 is a schematic drawing showing another embodiment according to this invention.

FIG. 5 shows another embodiment of the present invention, in which like reference numerals are used to denote like parts appearing in FIG. 1. The device shown in FIG. 5 differs from the device shown in FIG. 1 in that it employs the motors 26 and 27 for driving the specimen stage 12 and the aperture driving mechanism 14. The motor 26 is driven according to the output of the data processor 7 to which the control signal from a working distance (W.D.) designating means 28 arranged in the operational panel. Accordingly, the working distance designating means 28 is directly used as a positioning signal generator for generating the positional signal corresponding to the distance W (or Wd), whereas the focus adjusting means 18 is used as a positioning signal generator in the embodiment shown in FIG. 1. The driving mechanism 14 is driven automatically by the motor 27 according to the output of the data processor 7 in which the optimum aperture diameter (Da) is determined, so that the display means 19 in the embodiment shown in FIG. 1 is not incorporated in the embodiment shown in FIG. 5.

By the way, the data memorized in the ROM in the data processor 7 becomes an enormous amount when the number of the preset values of the parameters Ve, Ie and Wd is increased, so that a very large capacity of the ROM and a long operating time are required in the data processor 7. By using the device equipped with the converging lens system satisfying the following condition, it is possible to solve the above problem.

Namely, from FIG. 2, the following equation is obtained.

$$N \cdot \tan \frac{Da}{2(N-L)} = W \cdot \tan \alpha$$

When the values of α and Da/[2(N−L)] are very small, the above equation is rewritten as follows:

$$\frac{Da \cdot N}{2(N-L)} = W \cdot \alpha \therefore \alpha \frac{Da}{2(N-L)} \times \frac{N}{W}$$

When the position of the focus point of the condenser lens 9 is slightly shifted (N and (N−L) are approximately constant), the above equation is further rewritten as follows because the value of $$Da \cdot N/[2(N-L)]$$

becomes constant.

$$\alpha \simeq 1/W$$

When the equation $Cs \simeq W^4$ is satisfied within the variable range of (W), the following equation is obtained from equation (4).

$$\alpha_{op} \simeq \left(\frac{1}{C_s^2}\right)^{\frac{1}{4}} = \left(\frac{1}{C_s}\right)^{\frac{1}{4}} = \frac{1}{W} \simeq \alpha$$

This means that the relation $\alpha = \alpha_{op}$ is always maintained whereas the α varies according to the relation of $\alpha \simeq 1/W$ to the change of W.

From the above, in the device in which the coefficient of spherical aberration (Cs) is proportional to (W)$^4$, the amount of necessary data to be memorized as shown in TABLE and other similar tables becomes smaller than the case of the other devices, because the value of (W) or (Wd) does not need to be considered for determining the optimum aperture diameter (Da) theoretically. And, in the device in which the coefficient of spherical aberration (Cs) is not strictly but nearly proportional to (W), for example $Cs \simeq W^3$, it is possible to select the aperture diameter (Da) without consideration of the value of (W) or (Wd) actually. Further, in the device in which the value of (W) or (Wd) is fixed or varied within the very narrow range, it is of course possible to select the aperture diameter (Da) without consideration of the value of (W) or (Wd).

Having thus defined our invention in the detail and with the particularity required by the Patent Laws, what is desired protected by Letters Patent is set forth in the following claims.

We claim:

1. In an electron beam scanning device having an electron gun, an electron optical system including at least one condenser lens and an objective lens, said lenses for directing the electron beam over the surface of a specimen and an apertured baffle through which the electron beam passes for selecting the angle cone of the electron beam converging in a spot on the specimen surface, a specimen stage for shifting the specimens along the direction of the beam axis, the improvement comprising:

(a) first means for generating an input signal indicative of the desired electron beam accelerating voltage (Ve) in the electron gun;
(b) second means for generating an input signal indicative of the desired beam current (Ie) on the specimen surface;
(c) means for positioning the apertured baffle in order to change the selected aperture diameter (Da);
(d) first means for visual display of the selected electron beam current;
(e) second means for visual display of an operating condition for the baffle positioning means indicative of a selected aperture diameter (Da);
(f) third means for generating an input signal indicative of the distance (Wd) between the specimen and the principal plane of the objective lens;
(g) a data processor having a central processing unit and associated random access memory and means for receiving the input signals indicative of selected accelerating voltage (Ve) and selected specimen current (Ie), and means for outputting a signal to the first and second visual display means, said random access memory having stored therein data that defines the optimum baffle position for selected Ie, Ve, and Wd, said random access memory having stored therein a task for referring to the data for determining a desired operating condition of the baffle positioning means based upon the inputs from the first (Ve), second (Ie), and third (Wd) input signal generating means so that the diameter (dp) of the electron beam spot on the specimen becomes a minimum value (dm) and outputting said condition to the second display means.

2. The improvement according to claim 1, further comprising means for adjusting the condenser lens power supply to adjust the beam current Ie by changing the ratio of electron beam passing the aperture controlled by said data processor.

3. The improvement according to claim 1, for adjusting the objective lens power supply to adjust the focal length (W) controlled by said data processor.

4. In the improvement according to claim 1, said means for positioning the baffle is automatically positionable and further comprising control means responsive to an output from said data processor for activating the baffle positioning means to move the baffle to the desired condition.

5. The improvement according to claim 1, further comprising a third display means for displaying the calculated minimum value of the beam spot diameter (dm), said value being output from said data processor.

6. The improvement according to claim 1, further comprising a third means for generating a signal indicative of the desired distance between the objective lens and the specimen and in which the specimen stage is automatically shifted by the data processor in response to said signal from said third signal generating means.

7. The improvement according to claim 1, wherein the specimen stage is automatically shifted only within the range wherein $C_s \simeq W^4$ where $C_s$ is the spherical abberation coefficient and W is the distance between the specimen and the principal plane of the objective lens.

* * * * *